United States Patent
Sano

(10) Patent No.: US 7,924,206 B2
(45) Date of Patent: Apr. 12, 2011

(54) SWITCHED CAPACITOR CIRCUIT AND PIPELINE A/D CONVERTER

(75) Inventor: Mitsuhiro Sano, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 12/605,770

(22) Filed: Oct. 26, 2009

(65) Prior Publication Data

US 2010/0045495 A1 Feb. 25, 2010

(30) Foreign Application Priority Data

Nov. 5, 2008 (JP) ................................ 2008-284470

(51) Int. Cl.
*H03M 1/34* (2006.01)

(52) U.S. Cl. ........................................ 341/162; 341/161

(58) Field of Classification Search .................. 341/162,
341/161, 172, 155, 150, 120, 110, 118; 327/96,
327/554; 330/9; 345/690; 455/318, 255,
455/333, 110
See application file for complete search history.

(56) References Cited

U.S. PATENT DOCUMENTS

| | | | |
|---|---|---|---|
| 6,304,208 B1 | 10/2001 | Nagashima | |
| 6,727,749 B1 | 4/2004 | Quinn | |
| 6,784,824 B1 * | 8/2004 | Quinn | 341/172 |

FOREIGN PATENT DOCUMENTS

| | | |
|---|---|---|
| JP | 2000-209093 A | 7/2000 |
| JP | 2005-537749 A | 12/2005 |
| JP | 2009-027282 A | 2/2009 |

OTHER PUBLICATIONS

B.R. Gregoire, et al., "An Over-60dB True Rail-to Rail Performance Using Correlated Level Shifting and an Opamp with 30dB Loop Gain" IEEE ISSCC 2008 Conference Feb. 6, 2008, p. 540.

* cited by examiner

*Primary Examiner* — Joseph Lauture
(74) *Attorney, Agent, or Firm* — Morgan, Lewis & Bockius LLP

(57) ABSTRACT

There is provided a switched capacitor circuit and a pipeline A/D converter which are capable of suppressing electric power from being increased by utilizing a level-shift capacitor, even in a case where the switched capacitor circuit and the pipeline A/D converter are configured by utilizing a CLS technique. In the estimate phase, the capacitor Cc1 (level shift capacitor) is connected between the output terminal of the operational amplifier AMP2 and the inverting input terminal of the operational amplifier AMP2, so as to sample the output from the operational amplifier AMP2, and also to compensate the phase of the operational amplifier AMP2. Additionally, in the level shift phase, the capacitor Cc1 is connected between the output terminal of the operational amplifier 4 and the output terminal Vb, so as to be used to level-shift the output of the operational amplifier AMP2. Thereby, the load (the capacitance of the capacitors Cc1 and Cc2) on the operational amplifier AMP2 is reduced, thereby reducing the electric power of the switched capacitor circuit 200.

7 Claims, 5 Drawing Sheets

SWITCHED CAPACITOR CIRCUIT AND PIPELINE A/D CONVERTER

BACKGROUND OF THE INVENTION

1. Field of the Invention

The present invention relates to switched capacitor circuits and pipeline A/D converters, and more particularly, to a switched capacitor circuit and a pipeline A/D converter which are configured by utilizing CLS (Correlated Level Shift) technique and which are operated with low power consumption.

2. Description of the Related Art

In various image sensors, image processing circuits, and the like, there are known pipeline A/D converters in which a plurality of stages are cascade-connected in multiple stages to convert an analog signal into a digital signal, in order to process several types of signals for one clock. Each of the stages is configured with a switched capacitor circuit, an A/D converter, and the like, so as to output a digital signal of predetermined bits corresponding to an analog input signal. The pipeline A/D converter synthesizes the digital signals outputted from the respective stages, so as to thereby generate a digital signal corresponding to the analog signal.

First, with reference to FIG. 8, there will be described a circuit configuration of a typical switched capacitor circuit with an operational amplifier. FIG. 8 is a circuit configuration diagram showing a configuration of a typical switched capacitor circuit using an operational amplifier.

A switched capacitor circuit 600 shown in FIG. 8 is configured by including an input terminal Va, an output terminal Vb, an operational amplifier AMP1, switches SW1 to SW5, and capacitors C1 and C2.

The input terminal Va is a terminal to which an analog input signal Vin is inputted. The output terminal Vb is a terminal from which the analog input signal Vin that is inputted from the input terminal Va is amplified and then outputted as an analog output signal Vout.

The switches SW1 to SW5 are sampling switches for sampling (sampling and holding) the analog input signal Vin by switching the circuit connection state according to a control signal outputted, for example, from a control section (not shown).

The capacitors C1 and C2 are sampling capacitors which are respectively connected to the switches SW1 to SW5, and which are made to store and hold charge corresponding to the analog input signal Vin by the switching of connection states of the switches SW1 to SW5, so as to sample and hold the analog input signal inputted from the input terminal Va.

The operational amplifier AMP1 is configured to amplify the analog input signal Vin sampled and held by the capacitors C1 and C2, according to the amplification degree based on the gain A and the feedback amount based on the loop feedback coefficient β. When the switch SW3 is connected, the capacitors C1 and C2 are connected to the non-inverting input (+) terminal and the inverting input (−) terminal of the operational amplifier AMP1. Further, when the switch SW3 is disconnected, the capacitors C1 and C2 are connected to the inverting input terminal of the operational amplifier AMP1, and the non-inverting input terminal is connected to the ground.

In the switched capacitor circuit 600, firstly, in the sampling operation period (phase), the switches SW1 to SW3 are connected, whereas the switch SW4 and SW5 are disconnected. Then, charge corresponding to the analog input signal Vin is stored in the two capacitors C1 and C2, so that the analog input signal Vin is sampled.

Next, in the hold phase, the switches SW1 to SW3 are disconnected, and simultaneously the switches SW4 and SW5 are connected. The charge respectively stored in the capacitors C1 and C2 is held, so that the analog input signal Vin amplified by the operational amplifier AMP1 is outputted as the analog output signal Vout.

Signal processing is performed by alternately repeating the above described sampling and holding operations.

Incidentally, the output accuracy of the switched capacitor circuit 600 depends on the limited gain A of the operational amplifier AMP1 and the loop feedback coefficient β at the hold time. Further, the error amount of the switched capacitor circuit 600 is proportional to about $1/(\beta \cdot A)$. For this reason, sufficient output accuracy may not be obtainable in the event that the gain A of the operational amplifier AMP1 is not sufficiently large. Further, when the amplitude of the analog output signal Vout of the operational amplifier AMP1 is increased, the gain A of the operational amplifier AMP1 may be reduced. This causes the output amplitude to be limited.

In order to solve the above described problems, there is proposed a CLS (Correlated Level Shift) technique as disclosed in B. Rpbert Gregoire, Un-Ku Moon, "An Over-60 dB True Rail-to-Rail Performance Using Correlated Level Shifting and an Opamp with 30 dB Loop Gain", IEEE ISSCC 2008 Conference, Feb. 6, 2008, p 540.

Here, with reference to FIG. 9, there will be described a circuit configuration of a switched capacitor circuit configured by utilizing the CLS technique. FIG. 9 is a circuit configuration diagram showing a configuration of a switched capacitor circuit configured by utilizing the CLS technique.

A switched capacitor circuit 700 shown in FIG. 9 is configured by including the configuration of the switched capacitor circuit 600 shown in FIG. 8 and further including an operational amplifier AMP2, switches SW6 to SW8, and capacitors Ccls and Cc.

The operational amplifier AMP2 is configured to function similarly to the operational amplifier AMP1 as described above. However, the switched capacitor circuit 700 is configured such that the output terminal of the operational amplifier AMP1 is cascade-connected to the inverting input terminal of the operational amplifier AMP2, and such that the non-inverting input terminal of the operational amplifier AMP2 is connected to the ground. Thereby, the switched capacitor circuit 700 functions to increase the amplification degree so that stable output is made possible even in the case where the analog input signal Vin inputted from the input terminal Va of the switched capacitor circuit 700 is small. That is, in the switched capacitor circuit 700, the operational amplifier section is includes two stages with the two operational amplifiers AMP1 and AMP2.

The capacitor Ccls is used as a level shift capacitor which samples the amplified analog input signal outputted from the operational amplifier AMP2, and which level-shifts the sampled signal to the analog output signal Vout.

The capacitor Cc is connected in parallel to both a CLS circuit which includes the level shift capacitor Ccls and the switches SW6 to SW8, and which samples and shifts the level of the signal outputted from the operational amplifier AMP2, and the operational amplifier AMP2. The capacitor Cc is used as a phase compensation capacitor which compensates the phase of the operational amplifier AMP2. As described above, in the switched capacitor circuit 700, the operational amplifier section is configured in two stages by using the two operational amplifiers AMP1 and AMP2. Hence, the capacitor Cc serves as a phase compensation capacitor to enable the operational amplifiers AMP1 and AMP2 to stably operate.

The switches SW6 to SW8 are used as level shift switches for switching the connection state between the operational amplifier AMP2 and the capacitor Ccls.

In the switched capacitor circuit 700 shown in FIG. 9, the switches SW1 to SW5 operate similarly to the switches of the switched capacitor circuit 600 as described above, but the hold phase in the operation is divided into two phases of the estimate phase and the level shift phase.

First, in the estimate phase, the switches SW6 and SW7 are connected, and in addition, the switch SW8 is disconnected. Then, the capacitor Ccls is connected between the output terminal of the operational amplifier AMP2 and the ground, so that the analog input signal amplified by the operational amplifier AMP2 is sampled in the capacitor Ccls. Thereafter, in the level shift phase, the switch SW6 and SW7 are disconnected, whereas the switch SW8 is connected. Then, the capacitor Ccls is connected between the output terminal of the operational amplifier AMP2 and the output terminal Vb via the switch SW8, so that the output of the operational amplifier AMP2 is level-shifted to a common mode voltage.

Since the output signal of the operational amplifier AMP2 is level-shifted to the common mode voltage, the effective loop gain of the entire circuit has a value obtained by adding the product of the gain feedback coefficient β and the gain A of the operational amplifier AMP2 (=β·A) to the loop gain (β·A) in the estimate phase. Also, the gain A of the operational amplifier AMP2 in the level shift phase becomes a gain at the time when the output operational point of the operational amplifier AMP2 is common. For this reason, the operational amplifier AMP2 is capable of performing highly precise and substantially rail-to-rail output operations without limiting the amplitude of the outputs.

That is, in the switched capacitor circuit 700 configured by utilizing the CLS technique, it is possible to obtain a large gain even in the case where the operational amplifier has a small gain A. In addition, the signal component of the analog output signal Vout is made larger than the noise component of the analog output signal Vout. Therefore, the switched capacitor circuit 700 has an advantage in that S/N ratio characteristics are improved.

It should be noted, however, that the switched capacitor circuit configured by utilizing the CLS technique has the above described advantages. On the other hand, such a switched capacitor circuit additionally needs the level shift capacitor (capacitor Ccls) for sampling and level-shifting the operation result outputted from the operational amplifier. Thus, in some cases, the load of the operational amplifier is increased as compared with the conventional switched capacitor circuit, thereby electric power is increased.

In view of the above described problem, it is an object of the present invention is to provide a switched capacitor circuit and a pipeline A/D converter in which even when the switched capacitor circuit and the pipeline A/D converter are configured by utilizing the CLS technique, it is possible to suppress the electric power increased with the use of a level shift capacitor.

SUMMARY OF THE INVENTION

According to an aspect of the present invention, there is provided a switched capacitor circuit comprising: an input terminal to which an analog input signal is inputted; a plurality of sampling switches; a plurality of sampling capacitors which are respectively connected to the plurality of sampling switches and which sample and hold the analog input signal by switching the plurality of sampling switches; a plurality of operational amplifiers which are cascade-connected to each other and which amplify the analog input signal sampled and held by the plurality of sampling capacitors, so as to output the amplified analog input signal; a Correlated Level Shift (CLS) circuit including a level shift capacitor which samples and level-shifts the analog input signal amplified with the plurality of operational amplifiers, and a plurality of level shift switches which switch connection states between the level shift capacitor and the plurality of operational amplifiers; and an output terminal which outputs an output signal obtained by level-shifting of the amplified analog input signal, wherein the level shift capacitor is connected between an input of an operational amplifier arranged in a last stage of the plurality of operational amplifiers, and the output terminal, in a phase of sampling the amplified analog input signal.

In the above described configuration, the level shift capacitor is not only used to sample and level-shift the signal outputted from the operational amplifier, but also is used, in the estimate phase, to sample the amplified analog input signal and to compensate the phase of the operational amplifier. When the phase is compensated in the estimate phase, the level shift capacitor is connected in the loop between the output terminal and the inverting input terminal of the operational amplifier. Hence, the load imposed on the level shift capacitor in the operational amplifier is reduced according to the gain A of the operational amplifier. This reduces the load imposed on the operational amplifier by the level shift capacitor and the phase compensation capacitor, as compared with a case where the phase is compensated by only the phase compensation capacitor. As a result, the electric power in the switched capacitor circuit can be significantly reduced.

In the above described configuration, preferably, the level shift capacitor functions as a phase compensation capacitor of the operational amplifier in the last stage, in the phase of sampling the amplified analog input signal.

Thereby, the analog input signal to be sampled in the last stage by the level shift capacitor is set to the level of the analog input signal amplified in the preceding stage of the last stage, and hence has the highest level among the analog input signals amplified in the respective stages. Therefore, by using the level shift capacitor as the phase compensation capacitor of the last stage operational amplifier in the phase of sampling the amplified analog input signal, that is, in the estimate phase, it is possible to reduce the increase in electric power in the switched capacitor circuit as much as possible.

In the above described configuration, preferably, the level shift capacitor is connected between an output of the operational amplifier in the last stage and the output terminal in the phase of level-shifting the amplified analog input signal.

Thereby, in the level shift phase, the level shift capacitor is enabled to level-shift and output the analog input signal sampled in the last stage, similarly to the case where the phase of the load of the operational amplifier is compensated by only the phase compensation capacitor. As a result, it is possible to significantly reduce the increase in electric power in the switched capacitor circuit.

The above described configuration preferably further includes a second phase compensation capacitor connected between the inverting input terminal of the operational amplifier in the last stage and the output terminal.

Thereby, the phase of the last operational amplifier connected to the CLS circuit is compensated by the level shift capacitor and the second phase compensation capacitor. As a result, it is possible to stably operate the operational amplifier, and it is also possible to reduce the load on the operational amplifier, thereby significantly reducing the increase in electric power in the switched capacitor circuit.

In the above described configuration, preferably, the second phase compensation capacitor is preferably connected in parallel to both the CLS circuit and the operational amplifier in the last stage.

Thereby, the second phase compensation capacitor is connected in parallel to both the CLS circuit and the last stage operational amplifier, so that the phase of the operational amplifier is compensated by including not only the operational amplifier but also the CLS circuit which performs the level shift. This permits the operational amplifier to operate stably, and reduces the load on the operational amplifier, so as to significantly reduce the increase in electric power in the switched capacitor circuit.

The above described configuration preferably includes a parasitic capacitance between the input of the operational amplifier in the last stage and the output terminal, which capacitance functions as the phase compensation capacitance.

Thereby, the phase of the operational amplifier is compensated without using a plurality of phase compensation capacitors. Thereby, the load on the operational amplifier can be reduced by the level shift capacitor without increasing the number of elements in the switched capacitor circuit, so that electric power can be significantly reduced in the switched capacitor circuit.

According to another aspect of the present invention, there is provided a pipeline A/D converter comprising: a plurality of stages, each including the switched capacitor circuit according to claim 1, an A/D converter which converts an analog input signal inputted into the switched capacitor circuit to a digital signal, and a D/A converter which converts the digital signal converted by the A/D converter to an analog signal, the analog input signal being inputted into each of the plurality of stages and the analog input signal being converted into the digital signal and outputted, an analog output signal generated by the analog signal and the analog input signal being outputted to a subsequently connected stage; a memory that stores the digital signals outputted from the plurality of stages; and an operation circuit that performs a synthesis operation on the digital signals stored in the memory, and then outputs a digital output signal of a bit string.

It is therefore possible to reduce the load on the operational amplifier in each of the stages included in the pipeline A/D converter. It is also possible to significantly reduce the increase in electric power in the switched capacitor circuit. Therefore, even when the pipeline A/D converter is configured with the plurality of stages, it is possible to significantly reduce the increase in power consumption in the entire pipeline A/D converter.

According to an aspect of the present invention, the level shift capacitor is used not only to sample and level-shift the operation result outputted from the operational amplifier but also to sample the amplified analog input signal, in the estimate phase. At the same time, the level shift capacitor is used as a phase compensation capacitor for phase compensation of the operational amplifier. This makes it possible to reduce the load imposed on the operational amplifier by the conventional level shift capacitor and the phase compensation capacitor. It is therefore possible to reduce the increase in electric power in the switched capacitor circuit so as to operate the switched capacitor circuit with a low power.

In addition, the gain of the operational amplifier needs not be increased, so it is possible to obtain a highly precise large analog output signal even with a low power. Furthermore, the load on the operational amplifier is reduced, and the capacitance of the phase compensation capacitor can also be reduced as compared with the conventional technique. Thus, it is possible to reduce the size of the entire circuit by using a capacitor with a small capacitance, and to reduce manufacturing cost.

Moreover, each of the stages included in the pipeline A/D converter is configured with the switched capacitor circuit as described above, and hence the power consumption in each of the stages is reduced. For this reason, even in a case where the pipeline A/D converter is configured with the plurality of stages, it is possible to significantly reduce the power consumption in the entire pipeline A/D converter. Likewise, it is possible to reduce the size of the entire pipeline A/D converter, and to reduce manufacturing cost.

DETAILED DESCRIPTION OF THE PREFERRED EMBODIMENTS

In the following, preferred embodiments (examples) according to the present invention will be described with reference to the accompanying drawings.

Figure 1:
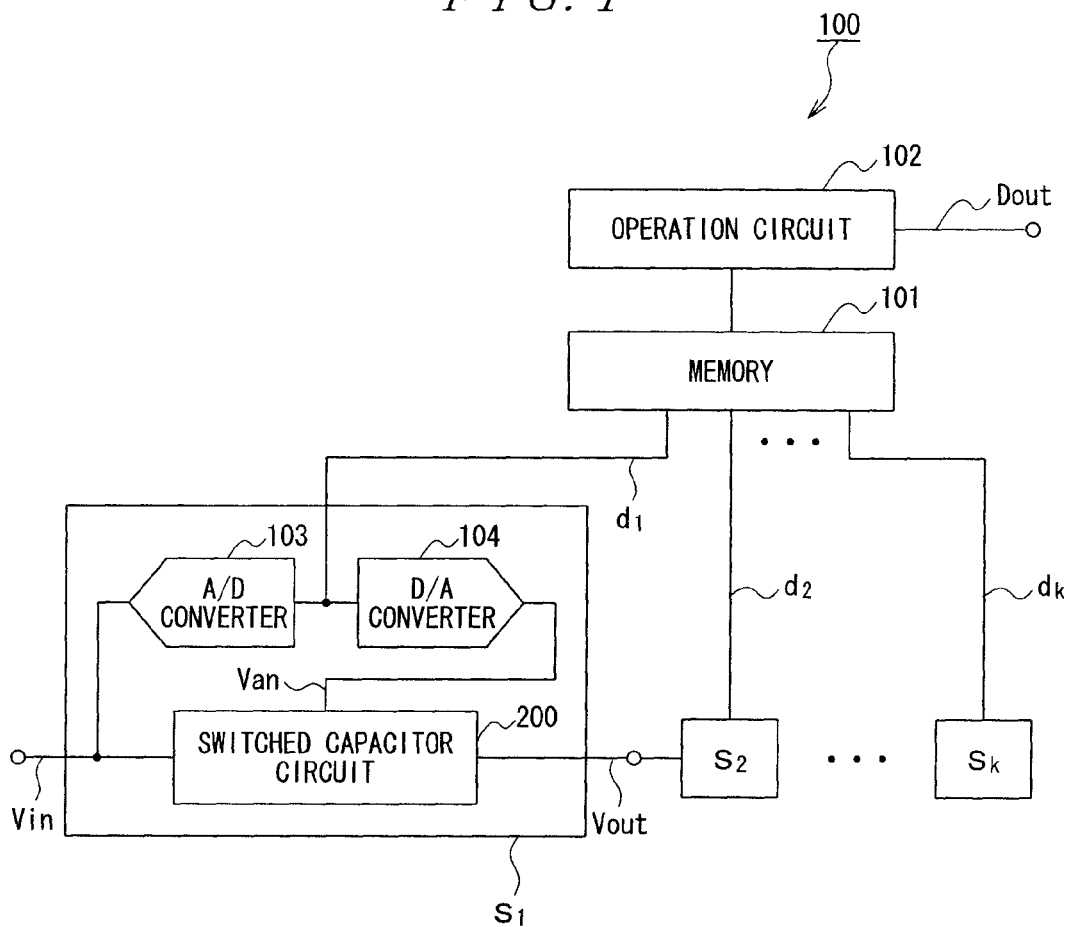
FIG. 1 is a block diagram illustrative of a configuration of a pipeline A/D converter according to the present invention.

First, with reference to FIG. 1, a configuration of a pipeline A/D converter will be described as an example of a device to which a switched capacitor circuit according to the present invention is applied. FIG. 1 is a block diagram illustrative of a configuration of a pipeline A/D converter according to the present invention.

A pipeline A/D converter 100 illustrated in FIG. 1 includes: a plurality of stages S1 to Sk which are cascade-connected to each other in multiple stages; a memory 101; and an operation circuit 102.

Each of the stages S1 to Sk includes: an A/D converter 103; a D/A converter 104; and a switched capacitor circuit 200.

Analog input signals Vin are inputted into the A/D converter 103 by sampling and holding operations, and each of the analog input signals is converted into each of digital signals d1 to dk. The digital signals d1 to dk outputted from the A/D converter 103 are inputted into the D/A converter 104 to be converted into an analog signal Van for outputting the signal.

The switched capacitor circuit 200 generates, by the sampling and holding operations, an analog output signal Vout from an analog input signal Vin inputted from an input terminal Va, as will be described below, together with the analog signal Van outputted from the D/A converter 104, so as to output the analog output signal Vout to the next stage S(n+1). Also, in the succeeding stages S(n+1) to Sk, the analog output signal Vout outputted from the preceding stage Sn is inputted as an analog input signal Vin, and the inputted analog input signal Vin is subjected to the same processing procedure so as to be outputted as an analog output signal Vout.

That is, in the stages S1 to Sk, the analog input signal Vin is inputted and then converted into the digital signals d1 to dk, and in addition, the analog output signal Vout, which is generated by the analog signal Van converted from each of the digital signals d1 to dk and the analog input signal Vin, is outputted to the subsequently connected stage S(n+1).

The memory 101 successively stores the digital signals d1 to dk outputted from the stages S1 to Sk, respectively. The operation circuit 102 performs a synthesis operation of each of the bit values of the digital signals d1 to dk stored in the memory 101, and then outputs a digital output signal Dout having a predetermined bit string corresponding to the analog input signal Vin.

Figure 2:
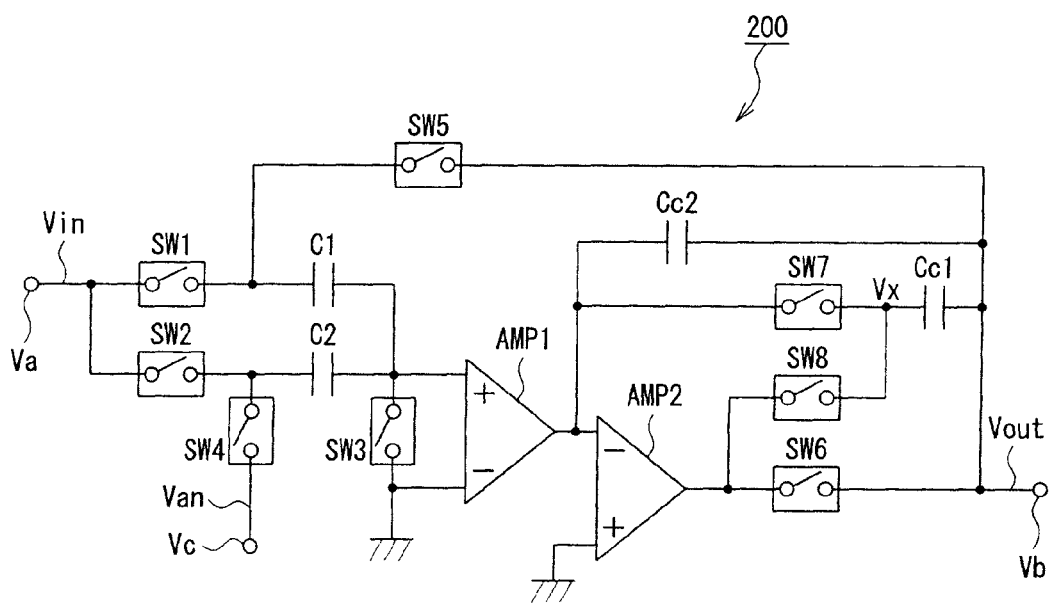
FIG. 2 is a circuit configuration diagram illustrative of a configuration of a switched capacitor circuit according to a first embodiment of the present invention.

Subsequently, there will be described a circuit configuration of a switched capacitor circuit according to a first embodiment with reference to FIG. 2. FIG. 2 is a circuit configuration diagram illustrative of a configuration of a switched capacitor circuit according to a first embodiment of the present invention.

Figure 9:
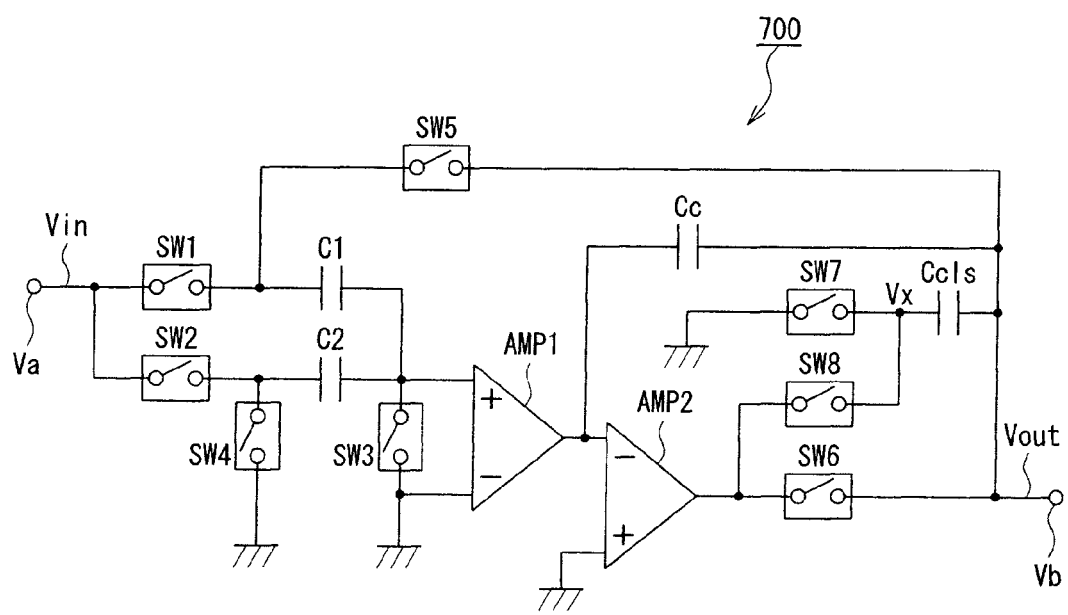
FIG. 9 is a circuit configuration diagram showing a configuration of a switched capacitor circuit configured by using a CLS technique.

The switched capacitor circuit 200 illustrated in FIG. 2 is a circuit including the same components as those of the switched capacitor circuit 700 shown in FIG. 9, but is different in that a capacitor Cc1 used as a level shift capacitor in the present embodiment is not connected to the ground via the switch SW7 but is connected to the inverting input terminal of the operational amplifier AMP2.

The input terminal Va is connected to the switched capacitor circuit 200 of the stage S(n−1) as the preceding stage of the stage Sn, and inputs therein the analog input signal Vin outputted from the switched capacitor circuit 200 of the preceding stage S(n−1). In addition, an output terminal Vb is connected to the switched capacitor circuit 200 of the subsequent stage S(n+1), and outputs the analog output signal Vout to be inputted into the switched capacitor circuit 200 of the next stage S(n+1). A D/A signal input terminal Vc is a terminal to which the analog signal Van converted by the D/A converter 104 of the stage Sn is inputted via the switch SW4.

The capacitor Cc1 is a level shift capacitor which functions substantially similarly to the capacitor Ccls of the switched capacitor circuit 700 shown in FIG. 9. However, in the estimate phase, the capacitor Cc1 is connected between the output terminal of the operational amplifier AMP2 and the inverting input terminal of the operational amplifier AMP2 (the output terminal of the operational amplifier AMP1) via the switch SW6 and SW7 (between an output node Vx and the output node Vout). The capacitor Cc1 not only functions to sample the amplified analog input signal outputted from the operational amplifier AMP2, but also compensates the phase of the operational amplifier AMP2. Also, in the level shift phase, the capacitor Cc1 is connected between the output terminal of the operational amplifier AMP2 and the output terminal Vb via the switch SW8 similarly to the switched capacitor circuit 700 shown in FIG. 9, and functions to level-shift the signal outputted from the operational amplifier 4. That is, in any phases, the capacitor Cc1 is not connected to the ground as in the switched capacitor circuit 700 shown in FIG. 9, but is used for both of the phase compensation and level shift of the operational amplifier AMP2.

Meanwhile, a capacitor Cc2 is a phase compensation capacitor which functions substantially similarly to the capacitor Cc of the switched capacitor circuit 700 shown in FIG. 9. The capacitor Cc2 is connected in parallel to both the CLS circuit which includes the level shift capacitor Cc1 and the switches SW6 to SW8, and which level-shifts the signal outputted from the operational amplifier AMP2, and the operational amplifier AMP2, so as to compensate the phase of the operational amplifier AMP2. As described above, the operational amplifier section has two stages in the switched capacitor circuit 200. Accordingly, the capacitors Cc1 and Cc2 compensate the phase necessary for the operational amplifier AMP1 and AMP2 to operate stably.

Figure 3A:
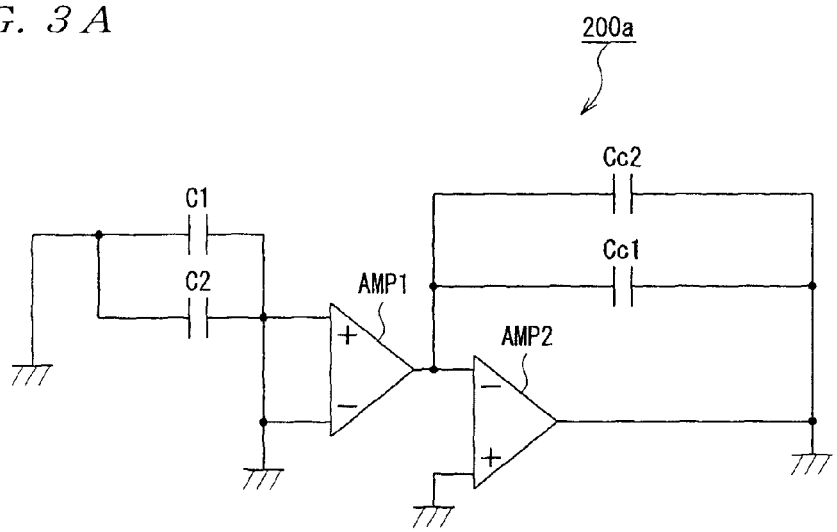
FIG. 3A to FIG. 3C are views of equivalent circuit diagrams illustrative of a sample phase, an estimate phase, and a level shift phase in the switched capacitor circuit according to the first embodiment of the present invention.
Figure 3B:
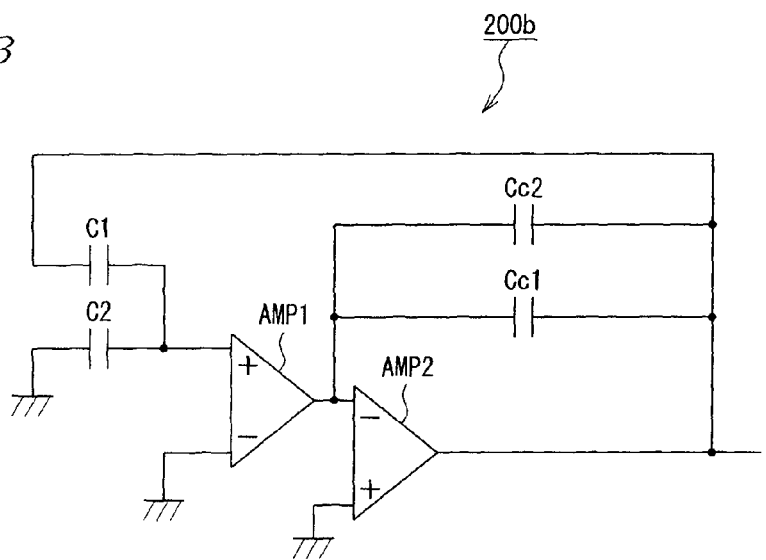
Figure 3C:
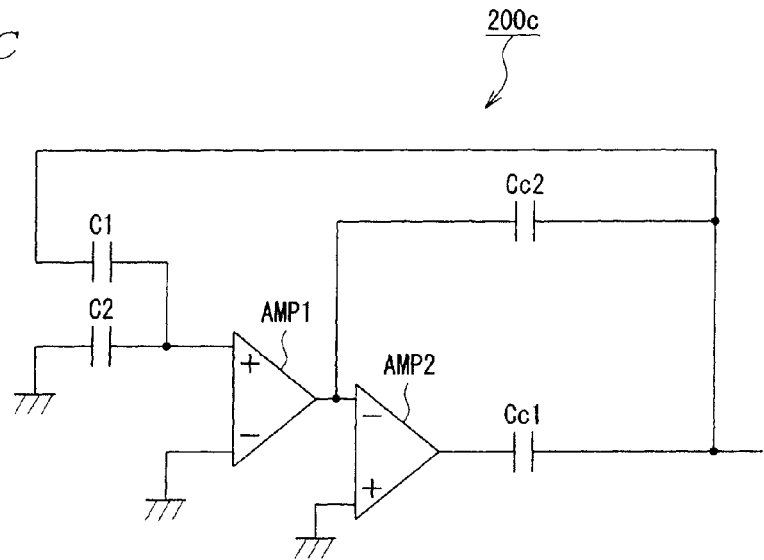

Subsequently, with reference to FIG. 3A to FIG. 3C, there will be described the effects of the sample phase, the estimate phase, and the level shift phase in the switched capacitor circuit according to the first embodiment of the present invention. FIG. 3A to FIG. 3C are views illustrative of equivalent circuit diagrams of the sample phase, the estimate phase, and the level shift phase in the switched capacitor circuit according to the first embodiment of the present invention.

FIG. 3A illustrates an equivalent circuit 200a in the sample phase of the switched capacitor circuit 200. FIG. 3B illustrates an equivalent circuit 200b in the estimate phase of the switched capacitor circuit 200. FIG. 3C illustrates an equivalent circuit 200c in the level shift phase of the switched capacitor circuit 200.

In the sample phase, in the first stage of the switched capacitor circuit 200, the switches SW1 to SW3 are connected and the switches SW4 and SW5 are disconnected, whereas the switches SW6 and SW7 are connected and the switch SW8 is disconnected in the subsequent stage of the switched capacitor circuit 200. In this situation, the charge corresponding to the analog input signal Vin is stored in the two capacitors C1 and C2, so that the analog input signal Vin is sampled.

Subsequently, in the estimate phase, in the first stage of the switched capacitor circuit 200, the switches SW1 to SW3 are disconnected and the switches SW4 and SW5 are connected, whereas the switches SW6 and SW7 remain to be connected and the switch SW8 remains to be disconnected in the subsequent stage of the switched capacitor circuit 200. In this situation, since the charge stored in the capacitors C1 and C2 is held in the first stage, a signal obtained by amplifying the analog input signal Vin with the operational amplifiers AMP1 and AMP2 is outputted. Also, in the subsequent stage, the level shift capacitor Cc1 is not connected between the output terminal of the operational amplifier AMP2 and the ground, but is connected between the output terminal of the operational amplifier AMP2 and the inverting input terminal of the operational amplifier AMP2. In addition, the level shift capacitor Cc1 samples the amplified analog input signal outputted from the operational amplifier AMP2, and also functions as a phase compensation capacitor.

That is, when the phase of the operational amplifier is compensated, the capacitor Ccls which is conventionally used only for the level shift is also used as the phase compensation capacitor Cc1, so that the phase is compensated by distributing the role of the conventional phase compensation capacitor Cc to the capacitor Cc1 and the capacitor Cc2. The load imposed on the operational amplifier AMP2 by the capacitors is reduced according to the gain A of the operational amplifier AMP2. Accordingly, the loads imposed by the conventional level shift capacitor Ccls and the phase compensation capacitor Cc can be made smaller than the load in a case where the phase is compensated only by the capacitor Cc. Moreover, the total capacitance of the capacitor Cc1 and Cc2 is made smaller than the capacitance of the capacitor Cc.

Then, in the level shift phase, when the switches SW6 and SW7 are disconnected and the SW8 is connected, the equivalent circuit 200c as illustrated in FIG. 3C is formed. In this situation, the capacitor Cc1 functions as the level shift capacitor similarly to the case of the switched capacitor circuit 700 shown in FIG. 9 as described above. Similarly to the conventional circuit, the output of the operational amplifier AMP2 is level-shifted to a common mode voltage and is outputted as the analog output signal Vout.

Figure 8:
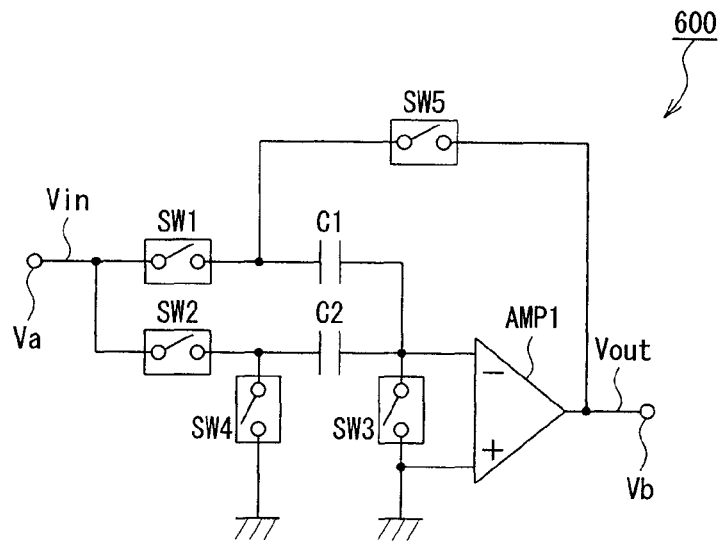
FIG. 8 is a circuit configuration diagram showing a configuration of a typical switched capacitor circuit using an operational amplifier.

By alternately repeating the above described operations, while maintaining the advantages of the CLS technique, it is made possible to suppress the power consumption of the switched capacitor circuit 200 according to the present embodiment to the same extent as in the normal switched capacitor circuit 600 shown in FIG. 8, in which the CLS technique is not utilized.

It is to be noted that capacitors having suitable capacitances may be employed as the capacitors Cc1 and Cc2 in accordance with the characteristics such as, for example, the stability and speed of the operational amplifier, which are determined by the limited gain A of the operational amplifier, the loop feedback coefficient β at the hold time, and the like. For example, the capacitors Cc1 and Cc2 may have a capacitance which completely cancels the capacitance of the conventional capacitor Ccls, or may have a capacitance which allows a part of the capacitance of the capacitor Ccls to be left in accordance with the circuit characteristics to be designed.

Figure 4:
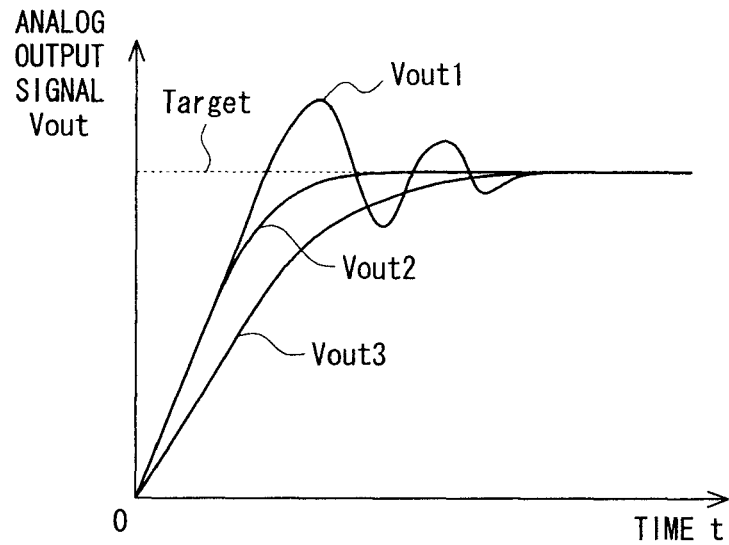
FIG. 4 is a graph illustrative of output characteristics of analog output signals of switched capacitor circuits.

Subsequently, with reference to FIG. 4, there will be described the output characteristic of the analog output signal of the switched capacitor circuit according to the first embodiment of the present invention. FIG. 4 is a graph exhibiting the output characteristics of the analog output signals of the switched capacitor circuits.

In FIG. 4, the horizontal axis represents the time t and the vertical axis represents the analog output signal Vout of the switched capacitor circuit. The analog output signal Vout1 represents the output characteristic of the analog output signal Vout in the switched capacitor circuit 700 shown in FIG. 9. The analog output signal Vout2 represents the output characteristic of the analog output signal Vout in the switched capacitor circuit 200 illustrated in FIG. 2. The analog output signal Vout3 represents the output characteristic of the analog output signal Vout when the output band of the feedback system in the switched capacitor circuit 700 shown in FIG. 9 is lowered.

In the switched capacitor circuit 700 configured by utilizing the conventional CLS technique, as shown in FIG. 9, the level shift capacitor Ccls is connected between the output terminal of the operational amplifier AMP2 and the ground in the estimate phase. For this reason, the level shift capacitor Ccls becomes the load on the operational amplifier AMP2, and then the stability of negative feedback is deteriorated. As a result, the output characteristic of the analog output signal Vout becomes that of the analog output signal Vout1 the amplitude of which is not stabilized until being settled to the target output value represented by the dotted line Target in FIG. 4.

Next, in the switched capacitor circuit 200 to which the present invention is applied, the level shift capacitor Cc1 is also used for phase compensation of the operational amplifier AMP2. Therefore, the load on the output side of the operational amplifier AMP2 is reduced, whereas the stability of the operational amplifier AMP 2 is improved. Thereby, the output characteristic of the analog output signal Vout becomes that of the analog output signal Vout2 which smoothly reaches the target output value represented by the dotted line Target within a short period as compared with the analog output signal Vout1.

Incidentally, it is usually possible to secure the stability of the amplifier circuit only by lowering the band of the entire feedback system, or by increasing the amount of current of the second stage operational amplifier AMP2. However, if the band of the entire feedback system is lowered, the output characteristic of the analog output signal Vout becomes the characteristic as exhibited by the analog output signal Vout3 in FIG. 4. In the output characteristic of the analog output signal Vout3, the time "t" taken until the output signal reaches the target value is delayed as compared with the output characteristic of the analog output signal Vout2. Besides, although the output characteristic of the analog output signal Vout3 is made the same as the output characteristic shown in the analog output signal Vout2 in the switched capacitor circuit 200 by increasing the amount of current in the second stage operational amplifier AMP2, the power consumption of the circuit is increased.

Generally, among the two operational amplifiers AMP1 and AMP2, the second stage operational amplifier AMP2 is particularly equipped with a factor for improving the stability and the speed in the signal amplification. Usually, as the current of the operational amplifier AMP2 is reduced, the stability is more deteriorated. However, in the switched capacitor circuit 200, even in a case where the current of the operational amplifier AMP2 is low, it is possible to obtain the output characteristic in which the output is stabilized smoothly within a short period.

Figure 5:
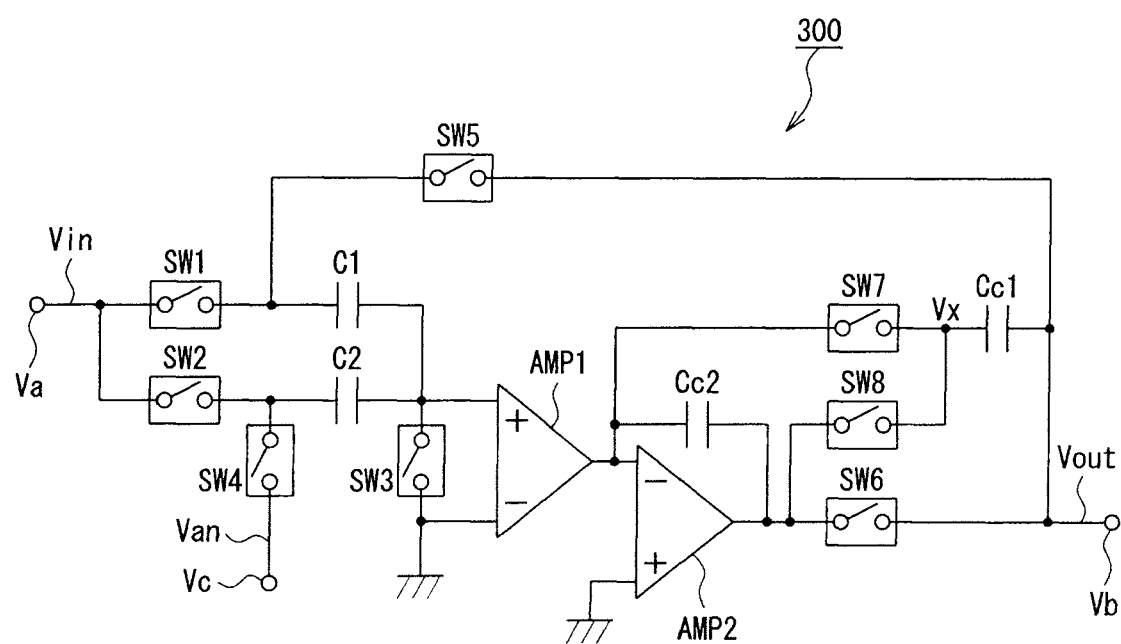
FIG. 5 is a circuit diagram illustrative of a configuration of a switched capacitor circuit according to a second embodiment of the present invention.

Subsequently, with reference to FIG. 5, there will be described a configuration of a switched capacitor circuit according to a second embodiment of the present invention. FIG. 5 is a circuit diagram illustrative of a configuration of a switched capacitor circuit according to the second embodiment of the present invention.

A switched capacitor circuit 300 illustrated in FIG. 5 is configured similarly to the circuit configuration of the switched capacitor circuit 200 according to the first embodiment illustrated in FIG. 2, but is different in that the capacitor Cc2 is connected between the output terminal and the inverting input terminal of the operational amplifier AMP2. Incidentally, the same components as those in the switched capacitor circuit 200 illustrated in FIG. 2 are denoted by the same reference characters, and their explanation is omitted.

In the switched capacitor circuit 300 according to the second embodiment of the present invention, the capacitor Cc2 is not connected in parallel to both the operational amplifier AMP2 and the CLS circuit, but is connected between the output terminal and the inverting input terminal of the operational amplifier AMP2, so as to compensate the phase of the operational amplifier AMP2. However, also in the switched capacitor circuit 300, the capacitors Cc1 and Cc2 perform compensate the phase of the operational amplifier AMP2 similarly to the switched capacitor circuit 200 illustrated in FIG. 2. For this reason, also in the switched capacitor circuit 300, while maintaining the advantages of the CLS technique, it is possible to suppress electric power to the same extent as in the conventional switched capacitor circuit 600 that does not utilize the CLS technique.

Figure 6:
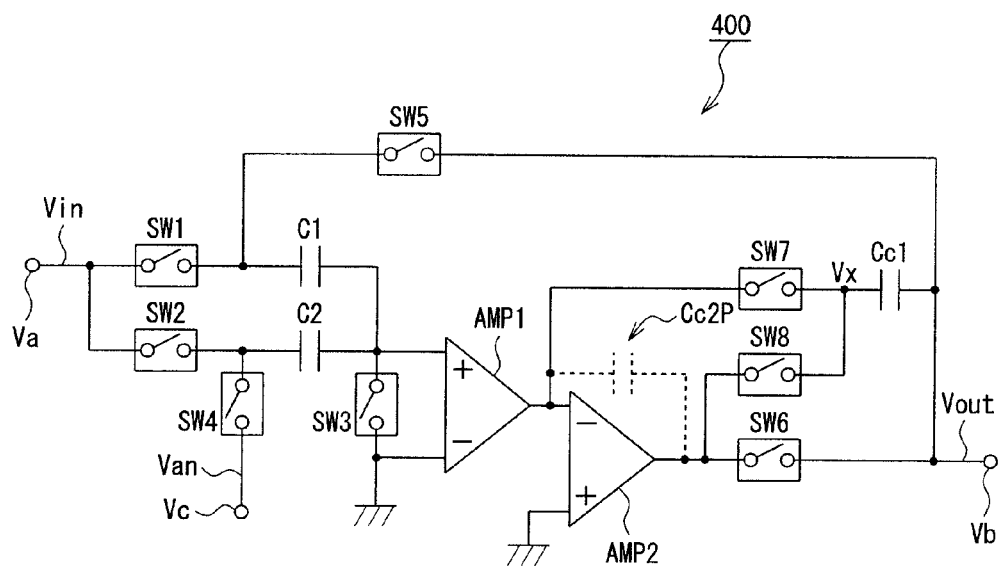
FIG. 6 is a circuit diagram illustrative of a configuration of a switched capacitor circuit according to a modification of the second embodiment of the present invention.

Subsequently, with reference to FIG. 6, there will be described a configuration of a switched capacitor circuit according to a modification of the second embodiment of the present invention. FIG. 6 is a circuit diagram illustrative of a configuration of a switched capacitor circuit according to a modification of the second embodiment.

A switched capacitor circuit 400 illustrated in FIG. 6 is configured similarly to the circuit configuration of the switched capacitor circuit 300 according to the second embodiment illustrated in FIG. 5, but is different in that the switched capacitor circuit 400 does not include the capacitor Cc2 of the switched capacitor circuit 300. However, the switched capacitor circuit 400 is configured such that the capacitance corresponding to the capacitor Cc2 is compensated by a parasitic capacitance Cc2P formed between an input differential pair of the gate and the drain of the operational amplifier AMP2 as represented by the dotted line image in FIG. 6.

Consequently, although the phase compensation capacitor Cc2 is not connected to the switched capacitor circuit 400, the parasitic capacitance Cc2P which functions as a phase compensation capacitor permits the switched capacitor circuit 400 to be configured as substantially the same as the switched capacitor circuit 300 illustrated in FIG. 5. Therefore, also in the switched capacitor circuit 400, similarly to the switched capacitor circuit 300 according to the second embodiment of the present invention, while maintaining the advantages of the CLS technique, it is possible to suppress electric power to the same extent as in the conventional switched capacitor circuit 600 that does not utilize the CLS technique.

It is to be noted that also in the switched capacitor circuits 200 and 300 according to the above described embodiments of the present invention, not only the capacitors Cc1 and Cc2 which function as the phase compensation capacitor but also the parasitic capacitance Cc2P formed between the input differential pair of the gate and drain of the operational amplifier AMP2 may also be used.

Figure 7:
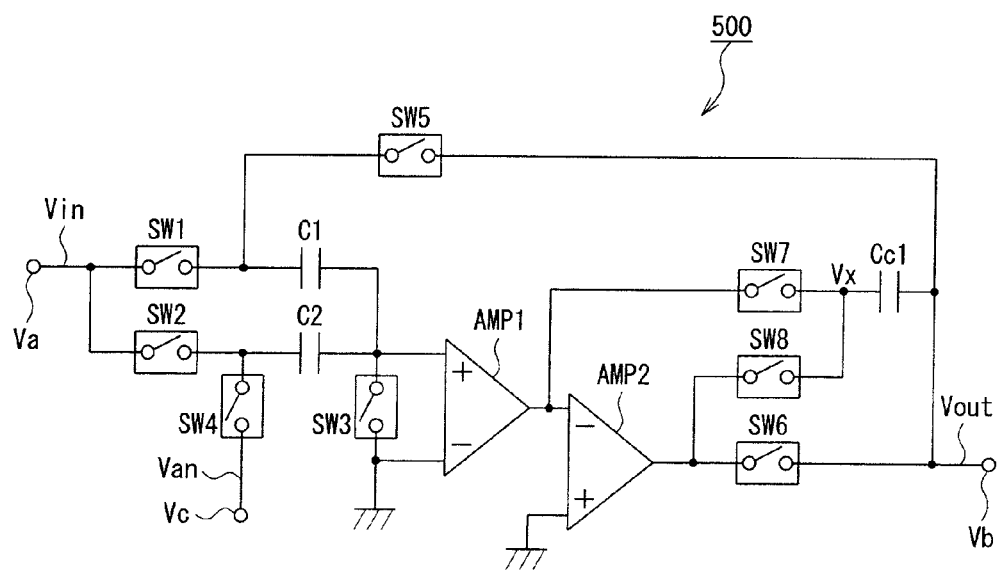
FIG. 7 is a circuit diagram illustrative of a configuration of a switched capacitor circuit according to a third embodiment of the present invention.

Then, with reference to FIG. 7, there will be described a configuration of a switched capacitor circuit according to a third embodiment of the present invention. FIG. 7 is a circuit diagram showing a configuration of a switched capacitor circuit according to the third embodiment of the present invention.

A switched capacitor circuit 500 illustrated in FIG. 7 is configured similarly to the circuit configuration of the switched capacitor circuit 200 according to the first embodiment illustrated in FIG. 2, but is different in that the switched capacitor circuit 500 does not include the capacitor Cc2 of the switched capacitor circuit 200. In addition, in the present embodiment, there is not provided the above described parasitic capacitance Cc2P formed between the input differential pair of the gate and the drain of the operational amplifier AMP2. However, as described above, since the capacitor Cc1 functions as a level shift capacitor in the level shift phase, and also functions as a phase compensation capacitor in the estimate phase, the increase in the load on the operational amplifier AMP2 can be suppressed.

Also, as in the present embodiment, even in the case where any of the capacitor Cc2 and the parasitic capacitance Cc2P formed between the input differential pair of the gate and the drain of the operational amplifier AMP2 is not provided, and where the phase of the operational amplifier AMP2 is compensated only by the capacitor Cc1, a capacitor having a suitable capacitance may be employed as the capacitor Cc1 in accordance with the characteristics such as, for example, the stability and the speed of the operational amplifier, to be determined by the limited gain A of the operational amplifier, the loop feedback coefficient β at the hold time, and the like. As described above, for example, the capacitor Cc1 may have a capacitance enough to completely cancel the capacitance of the conventional capacitor Ccls, or may have a capacitance which can leave a part of the capacitance of the capacitor Ccls in accordance with the characteristics of the circuit to be designed.

Regarding the configurations of the pipeline A/D converter and the switched capacitor circuit as described in each of the above embodiments, such as, for example, the configuration of each of the stages, and the capacitance and the connected position of each of the capacitors, descriptions have been given schematically to the extent that the present invention can be understood and implemented. Therefore, the present invention is not limited to the above described embodiments, and can be modified, within the scope and spirit of the present invention as set forth in the appended claims, in various forms in accordance with design elements, such as the operational amplifier, included in the pipeline A/D converter and the switched capacitor circuit.

The present invention is applicable to pipeline A/D converters each included in a CMOS image sensor, and the like, and to switched capacitor circuits in each of the stages included in the pipeline A/D converters.

What is claimed is:

1. A switched capacitor circuit comprising:
    an input terminal to which an analog input signal is inputted;
    a plurality of sampling switches;
    a plurality of sampling capacitors which are respectively connected to the plurality of sampling switches and which sample and hold the analog input signal by switching the plurality of sampling switches;
    a plurality of operational amplifiers which are cascade-connected to each other and which amplify the analog input signal sampled and held by the plurality of sampling capacitors, so as to output the amplified analog input signal;
    a Correlated Level Shift (CLS) circuit including a level shift capacitor which samples and level-shifts the analog input signal amplified with the plurality of operational amplifiers, and a plurality of level shift switches which switch connection states between the level shift capacitor and the plurality of operational amplifiers; and
    an output terminal which outputs an output signal obtained by level-shifting of the amplified analog input signal,
    wherein the level shift capacitor is connected between an input of an operational amplifier arranged in a last stage of the plurality of operational amplifiers, and the output terminal, in a phase of sampling the amplified analog input signal.

2. The switched capacitor circuit according to claim 1, wherein the level shift capacitor functions as a phase compensation capacitor of the operational amplifier in the last stage, in the phase of sampling the amplified analog input signal.

3. The switched capacitor circuit according to claim 1, wherein the level shift capacitor is connected between an output of the operational amplifier in the last stage, and the output terminal, in the phase of level-shifting the amplified analog input signal.

4. The switched capacitor circuit according to claim 1, further comprising a second phase compensation capacitor connected between the input of the operational amplifier in the last stage, and the output terminal.

5. The switched capacitor circuit according to claim 4, wherein the second phase compensation capacitor is connected in parallel to both the CLS circuit and the operational amplifier in the last stage.

6. The switched capacitor circuit according to claim 1, further comprising a parasitic capacitance which functions as a capacitance for phase compensation, between the input of the operational amplifier in the last stage and the output terminal.

7. A pipeline A/D converter comprising:
a plurality of stages, each including the switched capacitor circuit according to claim 1, an A/D converter which converts an analog input signal inputted into the switched capacitor circuit to a digital signal, and a D/A converter which converts the digital signal converted by the A/D converter to an analog signal, the analog input signal being inputted into each of the plurality of stages and the analog input signal being converted into the digital signal and outputted, an analog output signal generated by the analog signal and the analog input signal being outputted to a subsequently connected stage;
a memory that stores the digital signals outputted from the plurality of stages; and
an operation circuit that performs a synthesis operation on the digital signals stored in the memory, and then outputs a digital output signal of a bit string.

* * * * *